(12) United States Patent
Holsen et al.

(10) Patent No.: US 9,054,528 B2
(45) Date of Patent: Jun. 9, 2015

(54) EVENT SYSTEM AND TIMEKEEPING FOR BATTERY MANAGEMENT AND PROTECTION SYSTEM

(75) Inventors: Eivind Holsen, Trondheim (NO); Andreas Onsum, Trondheim (NO)

(73) Assignee: Atmel Corporation, San Jose, CA (US)

( * ) Notice: Subject to any disclaimer, the term of this patent is extended or adjusted under 35 U.S.C. 154(b) by 457 days.

(21) Appl. No.: 12/976,898

(22) Filed: Dec. 22, 2010

(65) Prior Publication Data

US 2012/0166841 A1   Jun. 28, 2012

(51) Int. Cl.
H02J 7/00 (2006.01)
H02H 7/18 (2006.01)
G01R 31/36 (2006.01)
H01M 10/42 (2006.01)
H01M 10/48 (2006.01)

(52) U.S. Cl.
CPC ............. *H02H 7/18* (2013.01); *G01R 31/3658* (2013.01); *H01M 10/425* (2013.01); *H01M 10/482* (2013.01); *H01M 10/486* (2013.01); *H01M 2010/4271* (2013.01); *H01M 2010/4278* (2013.01)

(58) Field of Classification Search
USPC ........................................................ 320/134
See application file for complete search history.

(56) References Cited

U.S. PATENT DOCUMENTS

| 5,955,869 A | 9/1999 | Rathmann |
| 6,012,153 A | 1/2000 | Brink et al. |
| 6,025,695 A | 2/2000 | Friel et al. |
| 6,040,722 A | 3/2000 | Lee |
| 6,078,165 A * | 6/2000 | Ashtiani et al. ............... 320/116 |
| 6,417,792 B1 | 7/2002 | King et al. |
| 6,555,997 B1 | 4/2003 | De Vries et al. |
| 6,710,578 B1 | 3/2004 | Sklovsky |
| 6,795,007 B2 | 9/2004 | Mayes |
| 7,236,110 B2 | 6/2007 | Antonesei |
| 7,567,063 B1 | 7/2009 | Suzuki et al. |
| 7,605,568 B2 | 10/2009 | Gangstoe et al. |
| 8,245,214 B2 | 8/2012 | Long et al. |
| 8,350,529 B2 | 1/2013 | Loncarevic |
| 2004/0070371 A1 | 4/2004 | Chern et al. |
| 2006/0170398 A1 | 8/2006 | Gangsto et al. |
| 2008/0189563 A1 | 8/2008 | Itkin |
| 2008/0197809 A1* | 8/2008 | Ho et al. ....................... 320/134 |
| 2008/0231232 A1 | 9/2008 | Seo et al. |
| 2008/0284383 A1 | 11/2008 | Aas et al. |
| 2008/0300660 A1 | 12/2008 | John |

(Continued)

OTHER PUBLICATIONS

AMTEL®: "8-bit AVR® Microcontroller with 16K/32K Bytes In-System Programmable Flash—ATmega16HVB, ATmega32HVB Preliminary", 8042B-AVR-06/10, 275 pages (Jun. 2010).

(Continued)

*Primary Examiner* — Edward Tso
*Assistant Examiner* — Robert Grant
(74) *Attorney, Agent, or Firm* — Fish & Richardson P.C.

(57) ABSTRACT

Operating a battery management and protection system includes generating a set of events each of which has a respective frequency $F/n_1, F/n_2 \ldots F/n_m$, where $n_i$ are integers. One or more of the events are provided to one or more modules in the system. The events, which are generated and provided to the modules independently of a central processing unit, trigger performance of respective actions by the modules.

19 Claims, 9 Drawing Sheets

(56) References Cited

U.S. PATENT DOCUMENTS

| | | | |
|---|---|---|---|
| 2009/0037754 | A1 | 2/2009 | Cha et al. |
| 2009/0198399 | A1* | 8/2009 | Kubo et al. ............... 701/22 |
| 2009/0224741 | A1 | 9/2009 | Marholev et al. |
| 2010/0229011 | A1 | 9/2010 | Pedersen et al. |
| 2010/0287389 | A1 | 11/2010 | Gangsto et al. |
| 2010/0332233 | A1 | 12/2010 | Chen et al. |
| 2011/0025277 | A1 | 2/2011 | Hussain et al. |
| 2011/0274952 | A1 | 11/2011 | Itagaki et al. |
| 2012/0161746 | A1 | 6/2012 | Holsen et al. |
| 2012/0162828 | A1 | 6/2012 | Holsen et al. |
| 2012/0166506 | A1 | 6/2012 | Holsen |
| 2012/0166841 | A1 | 6/2012 | Holsen et al. |
| 2012/0166918 | A1 | 6/2012 | Svendsli et al. |
| 2012/0170157 | A1 | 7/2012 | Holsen et al. |

OTHER PUBLICATIONS

ATMEL®: "8-bit AVR® XMEGA A Microcontroller—XMEGA Manual Preliminary", 8077H-AVR-12/09, 445 pages, (Dec. 2009).
Non-final office action issued in the U.S. Appl. No. 13/412,937 dtd Apr. 25, 2013, 12 pgs.
USPTO, Non-final Office Action issued in U.S. Appl. No. 12/976,884 dated May 17, 2013, 9 pgs.
USPTO, Non-final office Action issued in U.S. Appl. No. 12/976,845 dated Jan. 30, 2013, 9 pgs.
USPTO, Final Office Action issued in U.S. Appl. No. 12/976,865 dated May 24, 2013, 19 pgs.
USPTO, Non-final Office Action issued in U.S. Appl. No. 12/976,865 dated Dec. 28, 2012, 15 pgs.
Final office action issued in U.S. Appl. No. 12/976,845 dtd Aug. 14, 2013, 9 pgs.
Non-final office action issued in U.S. Appl. No. 13/410,806 dtd Aug. 15, 2013, 12 pgs.
Non-final office action issued in U.S. Appl. No. 12/976,865 dtd Sep. 13, 2013, 9 pgs.
Final office action issued in U.S. Appl. No. 12/976,884 dtd Oct. 23, 2013, 6 pgs.
Office action issued in the U.S. Appl. No. 12/976,845 dtd Jan. 29, 2014, 9 pgs.
Final office action issued in the U.S. Appl. No. 12/976,865, dtd Feb. 27, 2014, 11 pgs.
Non-final office action issued in the U.S. Appl. No. 12/976,777, dtd Nov. 19, 2013, 5 pgs.
Non-final office action issued in the U.S. Appl. No. 13/412,937, dtd Feb. 21, 2014, 14 pgs.
Notice of allowance issued in U.S. Appl. No. 12/976,777, dtd May 5, 2014, 8 pgs.
Non-final office action issued in the U.S. Appl. No. 12/976,884, dtd Feb. 28, 2014, 11 pgs.
Final office action issued in U.S. Appl. No. 13/410,806, dtd Feb. 6, 2014, 7 pgs.
Final office action issued in U.S. Appl. No. 12/976,845, dtd May 28, 2014, 11 pgs.
Notice of allowance issued in U.S. Appl. No. 13/410,806, dtd Jul. 8, 2014, 8 pgs.
Final office action issued in U.S. Appl. No. 12/976,884, dtd Jul. 29, 2014, 10 pgs.
Final office action issued in U.S. Appl. No. 13/412,937, dtd Jul. 31, 2014, 9 pgs.

* cited by examiner

EVENT SYSTEM AND TIMEKEEPING FOR BATTERY MANAGEMENT AND PROTECTION SYSTEM

BACKGROUND

Some modern portable devices (e.g., laptop computers, mobile phones, digital cameras, video cameras, media players, personal digital assistants (PDAs), game consoles) include battery packs. A particular type of battery pack includes one or more battery cells coupled to one or more integrated circuit (IC) chips. The chips typically include a controller (e.g., a microcontroller) and circuitry and provide, among other things, battery cell management and protection.

Some battery packs include a Li-ion (Lithium ion) battery cell, which is essentially a volatile chemical reaction packaged inside a cylinder or other enclosure. Potential energy is stored in each cell, and if the battery cell is exposed to conditions outside of its specification the cell can over heat, catch fire or explode. Some battery packs configured with these volatile cells include protection circuitry for detecting unsafe conditions (e.g., charge or discharge over-currents, short circuits), and for taking corrective action to prevent damage to the battery cell and/or device, and to protect the end user.

SUMMARY

The details of one or more implementations of the invention are set forth in the accompanying drawings and the description below.

In accordance with one aspect, operating a battery management and protection system includes generating a set of events each of which has a respective frequency $F/n_1$, $F/n_2 \ldots F/n_m$, where $n_i$ are integers. One or more of the events are provided to one or more modules in the system. The events, which are generated and provided to the modules independently of a central processing unit, trigger performance of respective actions by the modules.

Some implementations include one or more of the following advantages. For example, the disclosed techniques and event system can facilitate automating both critical and non-critical tasks in a battery management and protection system without the need for firmware involvement (i.e., independently of CPU 202). Thus, for example, the techniques and the event system can help provide a safe and predictable handling and response time for critical tasks, and can reduce the requirements for qualification of firmware. The techniques and event system also can help reduce power consumption. Some or all of the foregoing advantages may not be present in some implementations.

Other aspects, features and advantages of the invention will be apparent from the description and drawings, and from the claims.

DETAILED DESCRIPTION

In the following description, reference is made to a one-chip battery management and protection system in which a microcontroller, non-volatile memory and other circuit components are integrated in single integrated circuit. However, the system also can be realized in a multi-chip solution. As described below, the battery management and protection system includes autonomous safety and measurement features and can be used, for example, in a Li-ion or other battery management and protection system.

Figure 1:
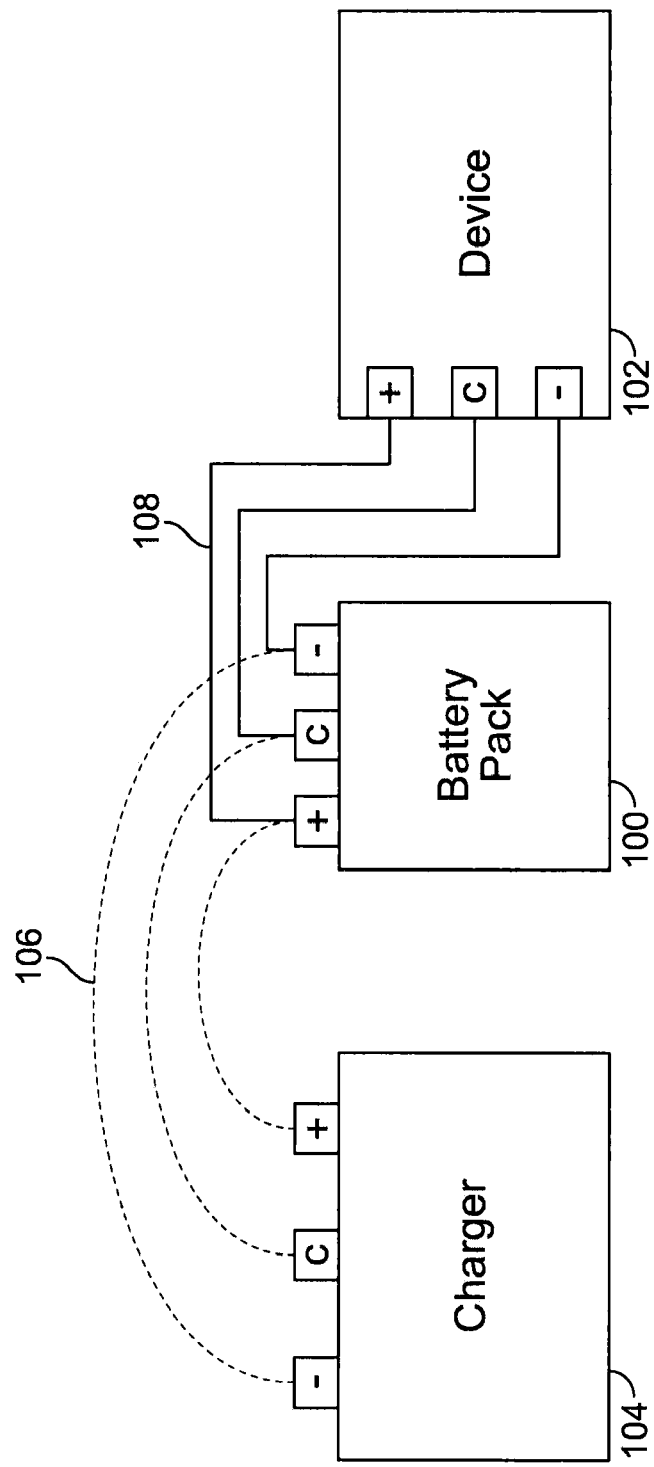
FIG. 1 is a diagram of an application including a battery pack.

As illustrated by FIG. 1, a battery pack 100 can be coupled either to a device 102 or a charger 104. When battery pack 100 is coupled to charger 104, terminals (e.g., positive and negative terminals and a communication terminal) of battery pack 100 are coupled by a medium 106 to corresponding terminals (i.e., positive and negative and communication terminals) of charger 104 to allow for charging of cell(s) associated with battery pack 100. Medium 106 can be in the form of wires, leads, pins, or other means of electrical connection.

Similarly, when battery pack 100 is coupled to device 102, terminals (i.e., positive and negative and communication terminals) of battery pack 100 are coupled by a medium 108 to corresponding terminals (i.e., positive and negative and communication terminals) of device 102 to allow for operation of device 102. Medium 108 can be in the form of wires, leads, pins, or other means of electrical connection. In some implementations, battery pack 100 also is coupled to device 102 and charger 104 at respective communication ports, which allow for the transfer of information (e.g., command and control) between the device 102/charger 104 and battery pack 100. One example of information that can be exchanged includes the battery charge level (i.e., capacity).

Figure 2:
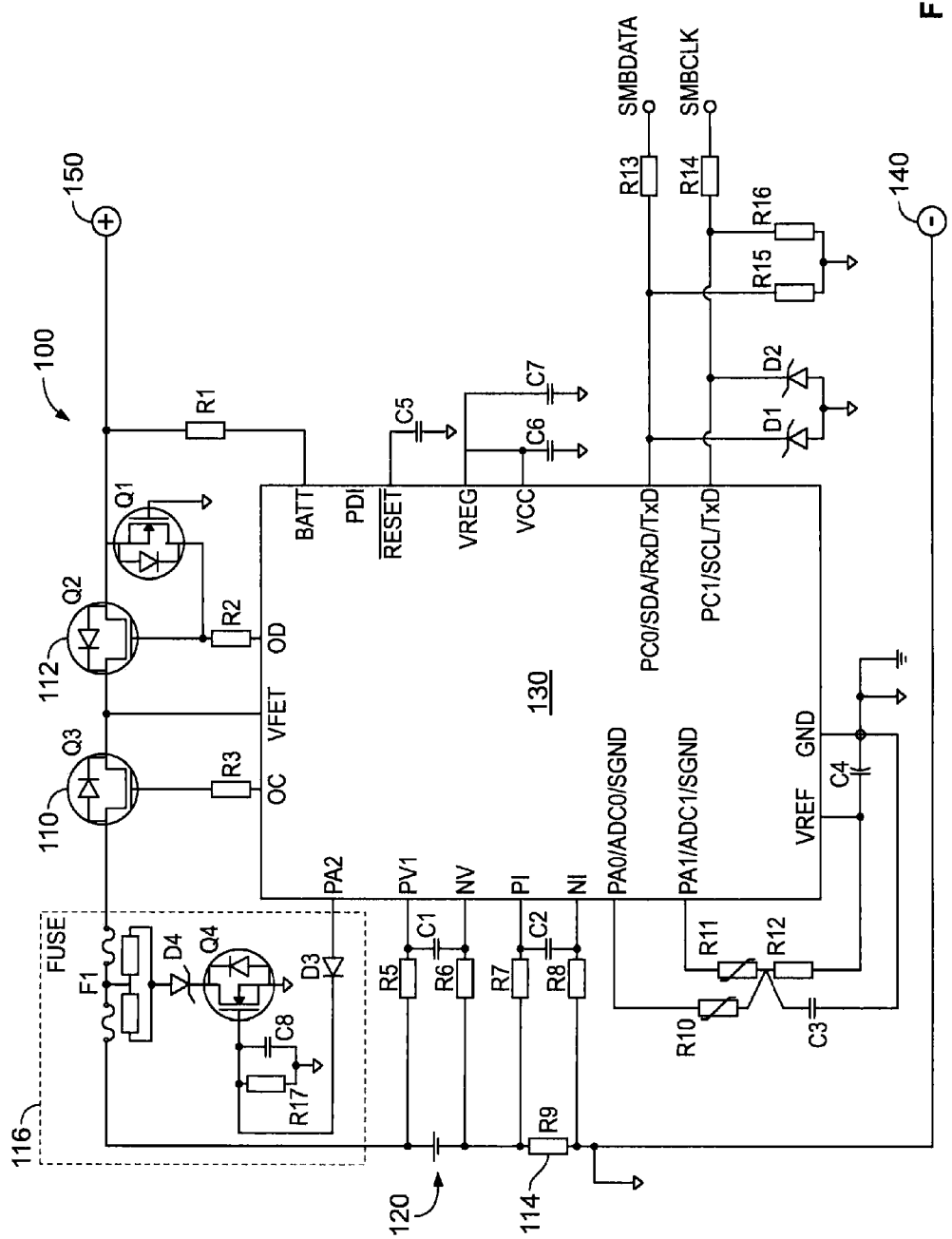
FIG. 2 is a schematic diagram of a battery pack operating circuit.

As shown in FIG. 2, battery pack 100 includes one or more battery cells 120, discrete transistors 110, 112, a sense resistor 114, and a battery management and protection system 130. System 130 includes various components, as discussed below, which can be integrated in a single package (e.g., integrated into a single integrated circuit) or packaged separately. Discrete transistors 110, 112 can be separate from system 130 and included in a separate package or can be packaged together with other system components.

Discrete transistors 110, 112 are used as switches to disconnect the battery cells 120 from the external battery pack terminals (i.e., external battery pack positive terminal 140 and negative terminal 150). In the illustrated implementation, two discrete transistors are shown, which can be implemented, for example, as field effect transistors (FETs). Although other transistor technologies can be used, FETs present advantages in terms of process, performance (e.g., on-resistance), cost and size. In the implementation shown, two transistors are provided and represent separate charge 110 and discharge 112 transistors. Charge transistor 110 is used to enable safe charging of the battery cells 120. Discharge transistor 112 is used to enable safe discharging of the battery cells 120.

As illustrated in FIG. 2, charge and discharge transistors 110, 112 are coupled in series. In some implementations, two N-channel FET (NFET) transistors are used and are coupled drain-drain in a series configuration. In other implementations, two P-channel FET (PFET) transistors can be used. In a PFET solution, additional diodes may be required to provide power to system 130.

In the illustrated implementation, charge and discharge transistors 110, 112 are coupled in a high-side configuration (i.e., the series transistors are coupled to the high side of the battery cell as opposed to a low-side configuration). In the high-side configuration shown, one terminal (e.g., source) of charge transistor 110 is coupled to the positive terminal of battery cell 120. One terminal (e.g., source) of discharge transistor 112 is coupled to the external battery pack positive terminal 150. Respective second terminals of charge and discharge transistors 110, 112 are coupled to each other (forming a drain-drain junction). Gates of charge transistor 110 and discharge transistor 112 are coupled to system 130 at inputs OC and OD, respectively.

The junction between the FET transistors 110, 112 is coupled to system 130 at an input (VFET), which provides operational power to system 130. An on-chip low drop-out (LDO) voltage regulator regulates the voltage at the VFET terminal to provide a suitable supply voltage (e.g., 2.2 V) for internal logic, I/O lines and analog circuitry. This regulated voltage also is provided to external pin VREG.

Battery cell 120 is a rechargeable battery and can be of the form of lithium ion (Li-ion) or lithium polymer (Li-polymer). Other battery technology types are possible. Where multiple cells are provided, the battery cells are coupled in series, in parallel, or in a combination of in series and in parallel. In the illustrated implementation, the positive terminal of battery cell 120 is coupled to system 130 (e.g., to allow for the detection of the battery voltage level at input PV1) and to one of the discrete transistors (i.e., the charge transistor 110). The negative terminal of the battery cell 120 also is coupled to system 130 (e.g., to allow for the detection of the battery voltage level at input NV) and to one terminal of sense resistor 114. Sense resistor 114 is coupled to system 130 (to allow for the measurement of current flow through sense resistor 114 at input PI). The second terminal of the sense resistor is coupled to local ground (smart battery local ground), the system 130 (to allow for the measurement of current flow through sense resistor 114 at input NI) and to the external battery pack negative terminal 140 of battery pack 100. Although a single battery cell implementation is shown, other numbers of battery cells can be included in battery pack 100. In some implementations, battery pack 100 also includes circuitry 116 that serves as a fuse.

Certain battery technologies can create dangerous conditions if improperly used. For example, Li-ion and Li-polymer batteries can overheat, explode or self-ignite if they are overcharged or discharged too rapidly. Dangerous conditions also can arise if the battery is discharged too deeply. Further, Li-ion and Li-polymer batteries can lose a significant amount of their charge capacity if they are too deeply discharged. System 130 includes supervisory electronics to help ensure fault free operation. Among other things, system 130 helps ensure that current flowing into and out of battery cell 120, as well as the voltage and temperature of battery 120, are within safe levels. Various aspects of system 130 are discussed in greater detail below.

Figure 3:
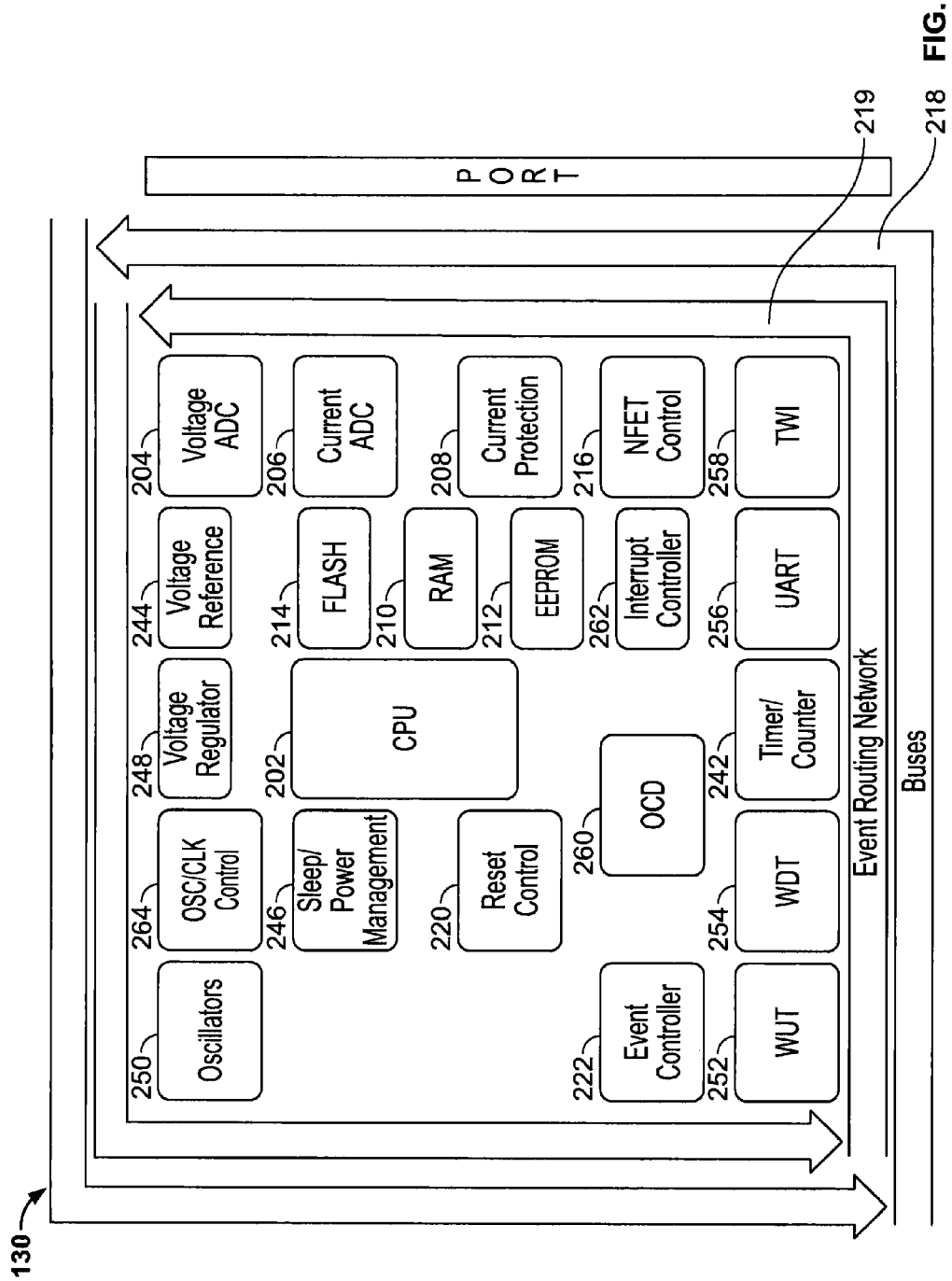
FIG. 3 is a block diagram illustrating various modules of a battery management and protection system.
Figure 4:
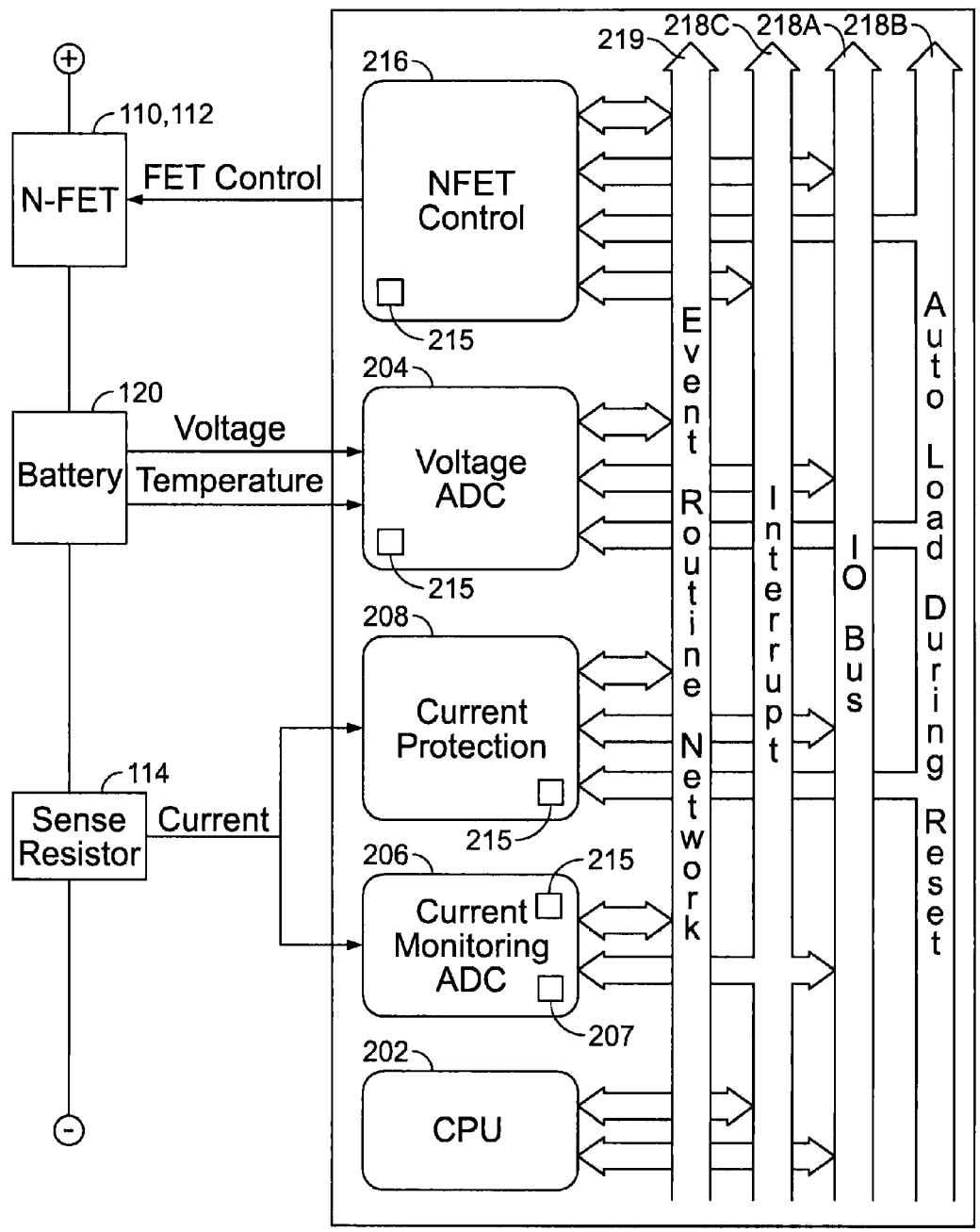
FIG. 4 illustrates some features of the system related to battery protection.

As illustrated in FIGS. 3 and 4, battery management and protection system 130 includes a software-based central processing unit (CPU) 202, which can be implemented, for example, as a low-power, CMOS 8-bit microcontroller based on a RISC architecture. CPU 202 ensures correct program execution and is able to access memories, perform calculations and control other modules in the system. Memory (e.g., flash memory 214) stores instructions that can be executed by CPU 202. Other memory in the illustrated battery management system 130 includes random access memory (RAM) 210 and EEPROM 212. Some implementations may include other types of memory.

In the illustrated example, the previously-mentioned on-chip LDO regulator that regulates the VFET terminal voltage to provide a suitable supply voltage for internal logic, I/O lines and analog circuitry, can be provided as part of voltage regulator 248. The regulated voltage also is provided at pin VREG (FIG. 2).

System 130 includes various modules that perform battery measurement and provide battery protection. Such modules include a voltage analog-to-digital converter (V-ADC) module 204, a current analog-to-digital converter (C-ADC) module 206, and a current protection module 208. These modules, which include circuits and logic, are discussed in greater detail below.

V-ADC module 204 can be implemented, for example, as a 16-bit sigma-delta analog-to-digital converter that is optimized for measuring voltage and temperature. It includes several selectable input channels such as scaled battery cell voltage, general purpose inputs (e.g., for use as an external temperature sensor), an internal temperature sensor, scaled battery voltage (BATT), and diagnosis functions. V-ADC 204 can execute single conversions or channel scans controlled by firmware (i.e., controlled by CPU 202). In addition, V-ADC module 204 can execute automatic battery protection scans. In the case of a scan for the single conversion/channel scan mode, CPU 202 selects the channels and starts the scan. In contrast, automatic protection scans are performed independently of firmware (i.e., independently of CPU 202). As explained in greater detail below, the automatic protection scan is configured with auto-loaded values during start-up of system 130. V-ADC module 204 executes a channel scan and compares measured values (e.g., of battery cell voltage and/or temperature) to auto-loaded trigger levels. These features can allow V-ADC module 204 to provide accurate, but configurable protection levels for battery cell voltage and temperature.

C-ADC module 206 is arranged to measure current flowing through an external sense resistor (e.g., sense resistor 114 in FIG. 2). In the illustrated implementation, C-ADC module 206 provides both instantaneous and accumulated outputs. The instantaneous current value can be useful for various critical tasks in battery management such as supervising charging current during under-voltage recovery and fast charge, monitoring state of the battery pack (e.g., standby or discharge), providing accurate over-current protection, and performing impedance calculations. C-ADC module 206 can include a window comparator 207 to determine whether the battery current is within a user-programmable range. This feature can be used, for example, to trigger when a charger is connected or disconnected and to detect the presence of excessively high charge or discharge currents. Thus, comparator 207 can generate an interrupt signal or other event when the instantaneous current is outside the specified range for a user-programmable number of samples. In some implementations, comparator 207 is configured to generate an "event" if the current is too high and an interrupt signal if the current is low. This and other "events" are discussed in greater detail below in connection with the event system (cf. FIG. 6).

Figure 5:
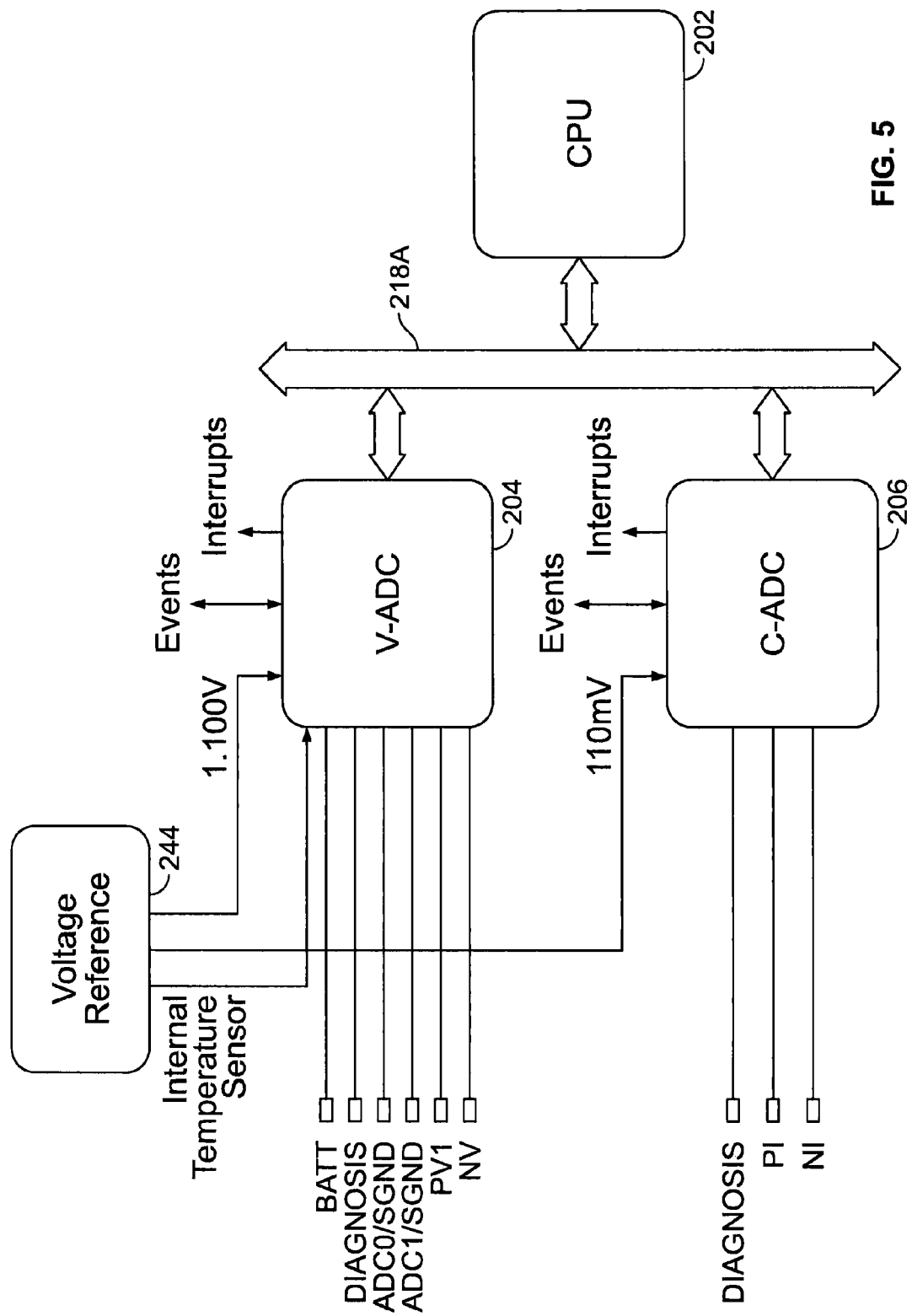
FIG. 5 illustrates further details of a battery measurement subsystem.

The illustrated system 130 includes a voltage reference module 244 that provides a highly accurate reference voltage (e.g., 1.100 V), as well as an internal temperature reference, to V-ADC module 204. An example of the connections among modules that form part of the battery measurement subsystem is illustrated in FIG. 5. The reference voltage also is provided to pin VREF (FIG. 2).

Current protection module 208 samples the voltage over sense resistor 114 at user-programmable intervals and compares the voltage against several programmable levels. The protection levels are configured by programming specific locations of the flash memory 214 (or EEPROM 212) with the desired protection levels. As explained in greater detail below, registers are loaded automatically from these flash memory locations during start-up of system 130. Violation counters enable time filtering of the over-current and the short-circuit current. In some implementations, current protection module 208 is configured to generate an "event" if the current is outside a specified range. This and other "events" are discussed in greater detail below in connection with the event system (cf. FIG. 6).

Battery management system 130 also includes a module 216 to control FET transistors 110, 112. In the illustrated implementation, FET controller 216 includes several outputs (e.g., OC, OD) coupled to external devices that can be configured by FET controller 216 to control the current flow between battery cell 120 and a device or charger. FET controller 206 includes circuits and logic for generating voltages at the outputs OC and OD. In some implementations, OC output is a high voltage output that is coupled to the gate of a charge FET (e.g., charge transistor 110) to completely or partially enable or disable the charge FET to control current flow during a charging event. OD output is a high voltage output that is coupled to the gate of a discharge FET (e.g., discharge transistor 112) to completely or partially enable or disable the discharge FET to control current flow during a discharging event.

CPU 202 and other modules send and receive signals over one or more buses 218 (FIG. 3). One such is input/output bus 218A (FIG. 4). Another bus 218B is used for loading safety and other parameters from flash memory 214 during start-up of system 130. The system also includes an interrupt bus 218C to communicate interrupt signals to/from CPU 202 or another module. In addition, a dedicated routing network 219 allows "events" to be sent between certain modules independently of CPU 202 and is discussed in greater detail below in connection with the event system (cf. FIG. 6).

As shown in FIG. 3, system 130 also includes a sleep/power module 246, discussed below. Other components and modules that are present in the illustrated implementation of system 130 include oscillators 250, wake-up timer 252, watchdog timer 254, universal asynchronous receiver/transmitter (UART) 256, bi-directional two-wire interface (TWI) bus 258, on-chip debug (OCD) module 260, interrupt controller 262 and oscillator/clock controller 264. A practical implementation of system 130 can include other components, modules and subsystems, which have been removed from FIG. 3 for clarity purposes. Some implementations may not include all the components, modules and subsystems shown in the example of FIG. 3.

Auto Loading of Safety and Calibration Parameters

To help improve safe operation of system 130, during system start-up various safety and calibration parameters are uploaded automatically from non-volatile memory to dedicated input/output registers in one or more of the modules.

Safety parameters can be used by the system to determine safety functionality of battery 120. In a particular implementation, user-programmable safety parameters are stored in dedicated locations in flash memory 214. During start-up of system 130, these parameters are loaded automatically by reset controller 220 (FIG. 3) from flash memory 214 to dedicated registers 215. Bus 218B (FIG. 4) is used to transfer the safety parameters from flash memory 214 to dedicated registers 215. CPU 202 can read registers 215, but cannot write to them. Thus, safety parameters stored in dedicated registers 215 cannot be changed at run-time. By automatically loading battery protection and calibration parameters from predefined locations during the start-up cycle (e.g., a reset cycle) in a manner that is independent of CPU 202 and firmware, safe operation of system 130 can be improved.

Registers 215 can be distributed across multiple different modules that implement critical safety functions. Registers 215 in V-ADC module 204 can store, for example, information for determining the channels used in a protection scan, determining the frequency of the protection scan, and indicating the threshold levels for cell voltage comparators. Registers 215 in current protection module 208 can store, for example, information relating to current protection control, short circuit protection timing, over-current protection timing, short-circuit detection levels, discharge over-current detection levels, and charge over-current detection levels. Registers 215 in FET controller 216 can store, for example, information relating to an action to be taken when a signal indicative of one of the following events is received: a short-circuit protection event, a discharge over-current protection event, a charge over-current protection event, a cell over-voltage protection event, a cell under-voltage protection event, an internal temperature over-voltage protection event, an internal temperature under-voltage protection event. Other safety parameters also can be uploaded and stored automatically during start-up in dedicated registers 215 in these or other modules of system 130.

Parameters used for calibrating various aspects of system 130 also can be automatically loaded during start-up (e.g., reset) from non-volatile memory 214 to dedicated input/output registers in the same manner as described above for the safety-related parameters. Examples of such parameters include parameters used to calibrate voltage references and parameters used to calibrate oscillators. In some implementations, calibration values can be stored in the non-volatile memory 214, for example, either during chip manufacture or by a customer. Some customers may prefer to use the manufacturer factory values to reduce factory testing costs, whereas some customers may prefer to choose the parameters for calibration to obtain better accuracy. Some implementations allow the customer to choose whether the parameters are loaded from a first location with manufacturer stored values or a second location with the customer's own values. Non-volatile memory can be used to allow the customer to make the selection.

In some implementations, a reset request resets the device and keeps it in a reset state as long as the request is active. When all reset requests are released, system 130 goes through several stages before the internal reset is released and the system starts running. Thus, in some implementations, before the internal reset is released, a counter delay is reset and started, oscillators are started, the counter delay times out, and the safety and calibration parameters are loaded from non-volatile memory 214 as explained above. Other operations that can occur during start-up (e.g., resetting) of system 130 include setting I/O registers to their respective initial values.

Event System for Inter-Module Communication

Although many communications within system 130 occur by way of CPU 202, system 130 also includes an event system for certain inter-module communications. The event system allows a change of state in one module in the system to trigger an action automatically in one or more other modules in the system independently of CPU 202. Such an indication of a change in a module is referred to as an "event." Events are passed between modules using a dedicated routing network 219 (FIGS. 3 and 4). The module that generates the event sometimes is referred to as the event generator, and the module using the event sometimes is referred to as the event user. The action that is triggered by the event sometimes is referred to as the event action. Some event users can receive events from one or more event generators and may result in the same or different event actions.

Figure 6:
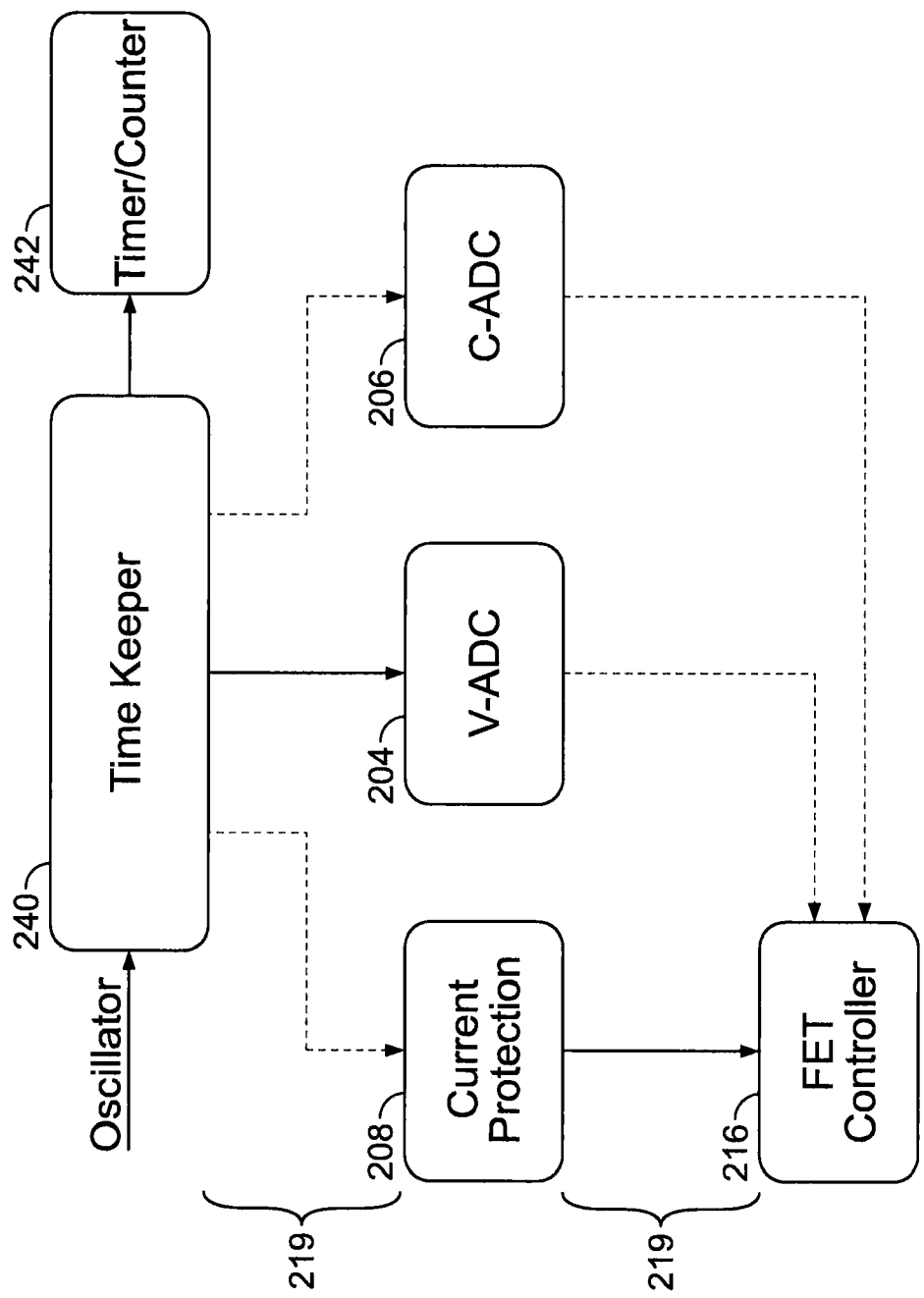
FIG. 6 illustrates some features of the system related to an event system for inter-module communications.
Figure 7A:
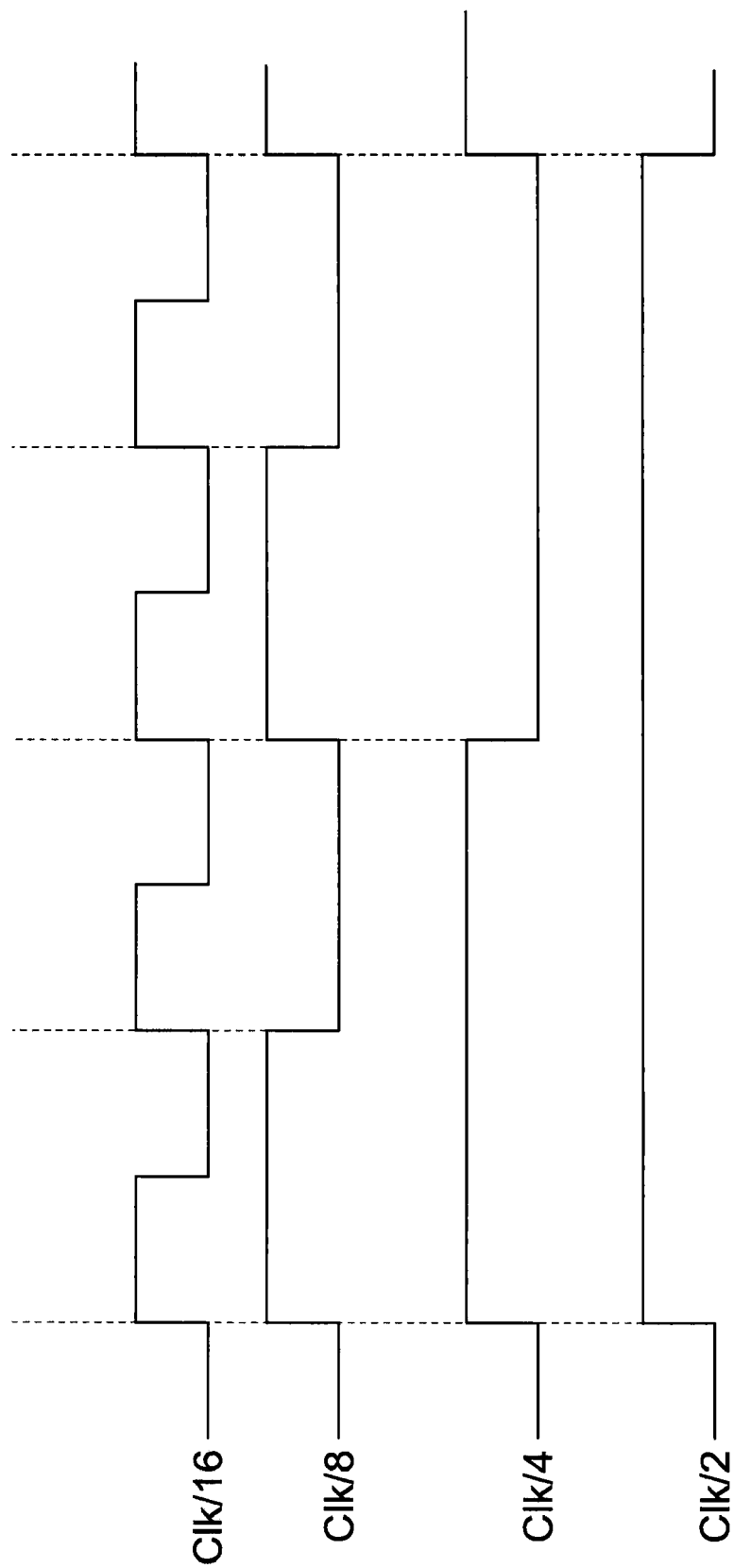
FIG. 7A is an example of clock signals generated by a timekeeper in the event system.

As shown in FIG. 6, one event generator is a timekeeper 240 that is part of event controller 222 (see FIG. 3). Timekeeper 240 serves as a centralized timer that controls when certain events occur and is coupled by dedicated routing network 219 directly to some of the modules, such as V-ADC module 204, C-ADC module 206 and current protection module 208. Timekeeper 308 generates events (e.g., pulse signals) that, in turn, trigger clock enable signals. In some implementations, the event signals can be used directly as clock signals. Timekeeper 308 can generate a set of divided event signals. For example, in the illustrated implementation, timekeeper 240 includes a prescaler that uses a event signal (elk) and generates power-of-2 divisions from the initial signal. Thus, timekeeper 240 generates a set of divided signals each of which has a respective frequency $clk/2 \ldots clk/2^n$, where n is an integer. In a particular implementation, timekeeper 240 generates a first event signal having a frequency clk/2, a second event signal having a frequency clk/4, a third event signal having a frequency clk/8, and a fourth event signal having a frequency clk/16 (FIG. 7A). In some implementations, timekeeper 240 generates additional or other synchronous event signals Thus, in some implementations, a second event signal is divided from the first event signal, the third event signal is divided from the second event signal, etc. In this way, when a slow event signal has an active edge, the faster event signals have an active edge as well. In other situations, the division factors can be any series of integer numbers (e.g., clk/2, clk/3, clk/4). In general, timekeeper 240 generates a set of divided signals each of which has a respective frequency $F/n_1, F/n_2 \ldots F/n_m$, where $n_i$ are integers.

Timekeeper 240 is used to generate events for the modules connected to timekeeper 240. Each module can individually select the desired clock division (e.g., based on information auto-loaded to the registers 215 during start-up). For example, a first module (e.g., V-ADC module 204) can be programmed to clk/32, a second module (e.g., C-ADC module 206) can be programmed to clk/128, and a third module (e.g., current protection module 208) can be programmed to clk/32. In this example, the first and third modules 204 and 208 receive events at the same time, whereas the second module 206 receives events at one-fourth the frequency. In the illustrated example, timekeeper events to all modules are synchronous. When the second module receives events, the first and third modules will receive events at the same time. Timekeeper events can be used, for example, to trigger measurements and detect safety issues.

Timekeeper 240 acts as an initiator for some event sequences. At regular intervals, timekeeper issues events to initiate actions in other modules (e.g., V-ADC module 204, C-ADC module 206 and current protection module 208). The event sequences for run-time configurable protection events are initiated by timekeeper 240 and trigger event actions, for example, in C-ADC module 206. In the illustrated example, event sequences for auto-loaded protection events also are initiated by timekeeper 240 and trigger event actions in V-ADC module 204 and current protection module 208. Examples of actions that can be set to trigger on regular events from timekeeper 240 include the following: V-ADC module protection scan, C-ADC module current measurements, regular current detection, high charge/discharge current detection, current protection module measurements, short circuit detection, and charge/discharge over current detection.

Each of V-ADC module 204, C-ADC module 206 and current protection module 208 can act, in turn, as an event generator. For example, events generated by C-ADC module 206 can trigger one or more event actions in FET controller 216. For this purpose, C-ADC module 206 is connected to FET controller 216 by way of dedicated routing network 219 so that such events can be communicated from C-ADC module 206 directly to FET controller 216 independently of CPU 202. Likewise, V-ADC module 204 and current protection module 208 can trigger one or more event actions in FET controller 216. For this purpose, V-ADC module 204 and current protection module 208 also are connected to FET controller 216 by way of dedicated routing network 219 so that such events can be communicated directly from V-ADC module 204 or current protection module 208 to FET controller 216 independently of CPU 202.

An example of an action that can be established to trigger based on events from the foregoing modules is disabling FETs 110, 112. For example, FETs 110, 112 can be disabled automatically based on one or more of the following events: V-ADC channel over/under-voltage, V-ADC channel over/under-temperature, C-ADC high charge/discharge current, C-ADC discharge current detection at low voltages, current protection module charge/discharge over-current, and current protection module short-circuit.

The event system facilitates automating both critical and non-critical tasks in a battery management and protection system without the need for firmware involvement (i.e., independently of CPU 202). Thus, for example, the event system can help provide a safe and predictable handling and response time for critical tasks, and can reduce the requirements for qualification of firmware. At the same time, the battery management and protection system can provide flexibility by allowing certain safety-related parameters to be user-configurable as described above. For non-critical tasks, the event system can help reduce the time CPU 202 needs to be in active mode. Thus, the system can help reduce power consumption.

The event system also can be used to support other events that are not critical for battery protection event loops. For example, events from timekeeper 240 can be used to increment a timer/counter 242 (FIGS. 3 and 5).

The event system also can be used to trigger the execution of various system calibrations at regular intervals independently of CPU 202. Using the event system allows the calibration to be triggered simultaneously with other events. As events occur synchronously, measurements triggered by event signals from the timekeeper can be performed synchronously as well, thereby reducing the time that central modules are enabled. This, in turn, can reduce overall power consumption. For example, events generated by timekeeper 240 can help ensure that the calibration of oscillators 250 is performed at regular intervals without the need for action by CPU 202. This allows calibration to be performed at the same time as other activities that require the same shared resources, thus minimizing power consumption. Thus, the system can be arranged to initiate run-time calibration of the system based on one or more of the timekeeper events.

Figure 7B:
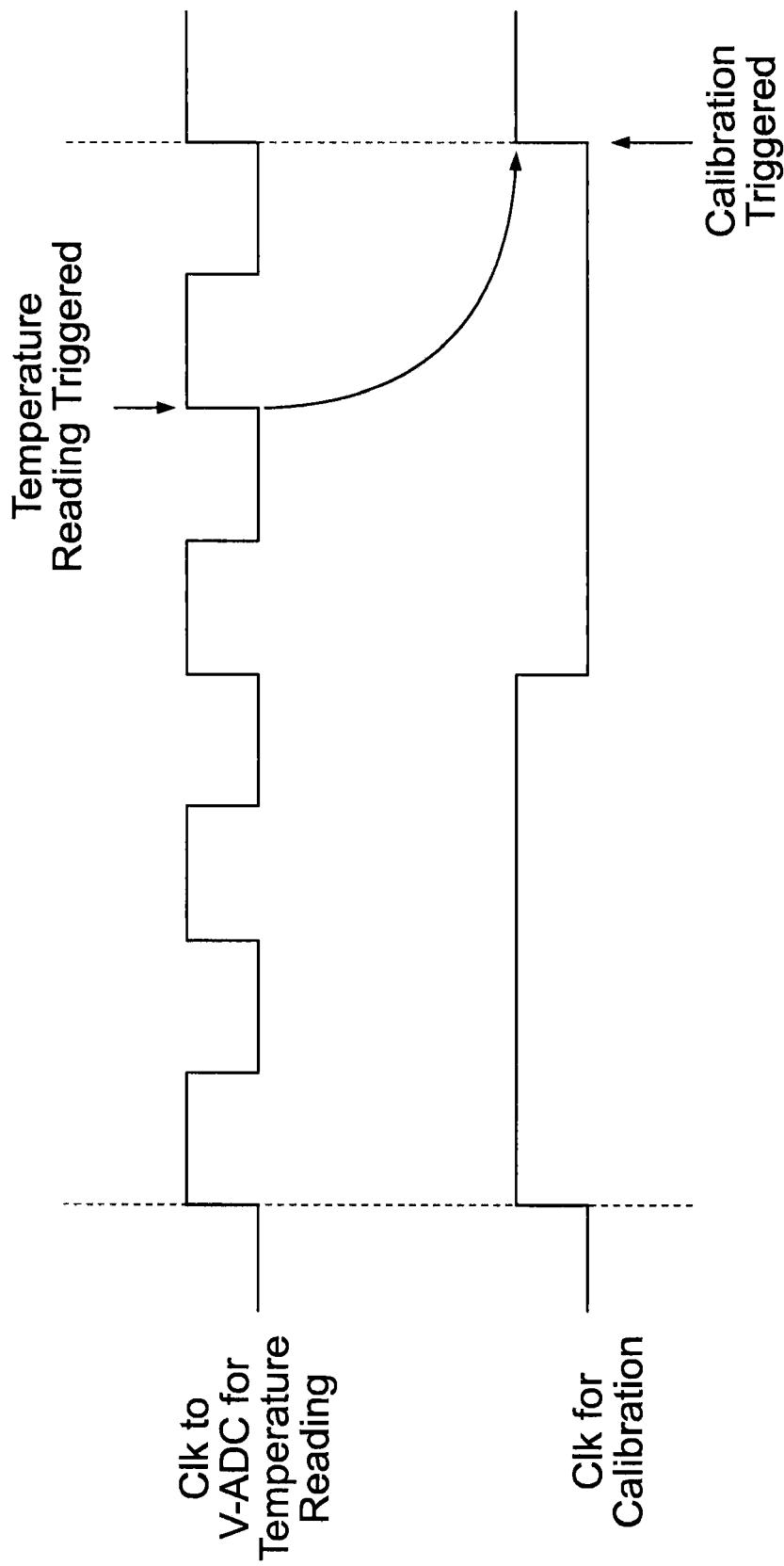
FIG. 7B is an example of timing signals generated by the timekeeper to trigger oscillator calibration.

For example, high accuracy oscillators use a fairly high amount of power. To address this issue, in some implementations, a reference oscillator is turned on only at regular time intervals. The time interval can be based, for example, on a parameter auto-loaded from non-volatile memory 214 to a dedicated register 215 during start-up. Temperature variation of the oscillator can be addressed, for example, by calibrating the oscillator with respect to a measured temperature at some regular time interval. In some implementation, system 130 is configured to calibrate the oscillator by calculating a target cycle ratio between the reference oscillator and the target oscillator based, in part, on the last temperature reading by V-ADC module 204. Using timekeeper 240 to trigger the temperature readings as well as the subsequent calibration allows the various actions to be performed synchronously at precisely determined times, as shown in the example of FIG. 7B.

In some implementations, in the absence of timekeeper 240, various other modules would need to be implemented with their own individual prescalers, which would increase the overall cost of system 130. Thus, providing centralized timekeeper 240 in system 130 can result in cost savings. Furthermore, ensuring synchronous operation may be more complicated without the central timekeeper.

Measurement Subsystem

As indicated above, various modules provide battery measurement functions. The measurement subsystem performs automatically-controlled safety-related measurements of the battery as well as CPU-controlled state-of-charge and state-of-health battery measurements.

Modules that form part of the battery measurement subsystem include V-ADC 204 module, C-ADC module 206, current protection module 208 and voltage reference module 248. As explained above, these modules include dedicated registers 215 that are auto-loaded with safety parameters independently of CPU 202 during start-up of system 130. Furthermore, critical safety-related measurements are triggered by events that are generated by timekeeper 240 and communicated over event routing network 219 independently of CPU 202. Thus, the same modules that perform firmware-controlled measurements involving CPU 202 also perform safety-related measurements of the battery that are independent of CPU 202. Using the same hardware modules to perform both types of battery measurements can, in some cases, reduce the size and cost of system 130.

Sleep and Power Management

Sleep/power management control module 246 (FIG. 3) allows battery management system 130 to enter one or more sleep (i.e., low-power) modes to reduce power consumption. The sleep modes can be entered from an active mode in which CPU 202 is executing application code. The application code decides when to enter a sleep mode and what sleep mode to enter. Interrupt signals from enabled modules and enabled reset sources can restore CPU 202 from a sleep mode to active mode.

One type of sleep mode available in some implementations is referred to as an idle mode, in which operations of CPU 202 and non-volatile memory are stopped. In the idle mode, other modules, including event controller 222 (discussed above) and an interrupt controller 262 (see FIG. 3), continue operating while they are enabled. Interrupt requests from enabled interrupt signals wake system 130. To reduce power consumption in the idle mode, modules that are not in use can be actively disabled.

Some implementations also may support additional or alternative low-power or sleep modes in which some of the modules in system 130 are asleep. For example, some implementations include a power-save mode, in which various modules (e.g., V-ADC module 204 and C-ADC module 206) normally are not able to operate, even though they are enabled. To reduce power consumption in power-save mode to a minimum, modules that are operating from enabled oscillators and are not in use should be actively disabled. This will stop the clocks to the modules and thus can contribute to significantly reduced power consumption.

Modules connected to the event system support "sleep-walking." Situations may arise, or example, in which system 130 is in a sleep mode, but a particular module in the event system needs to send an event to another module. If the target module is sleeping (i.e., is in a low-power mode), the event automatically triggers an enable request to the target module to enable the target module to process the event and return to sleep. Dedicated event routing network 219 can be used to communicate the enable request to the target module. Modules normally not operating in a given sleep mode can still be operated in the sleep mode, triggered by the sleepwalking feature.

Figure 8:
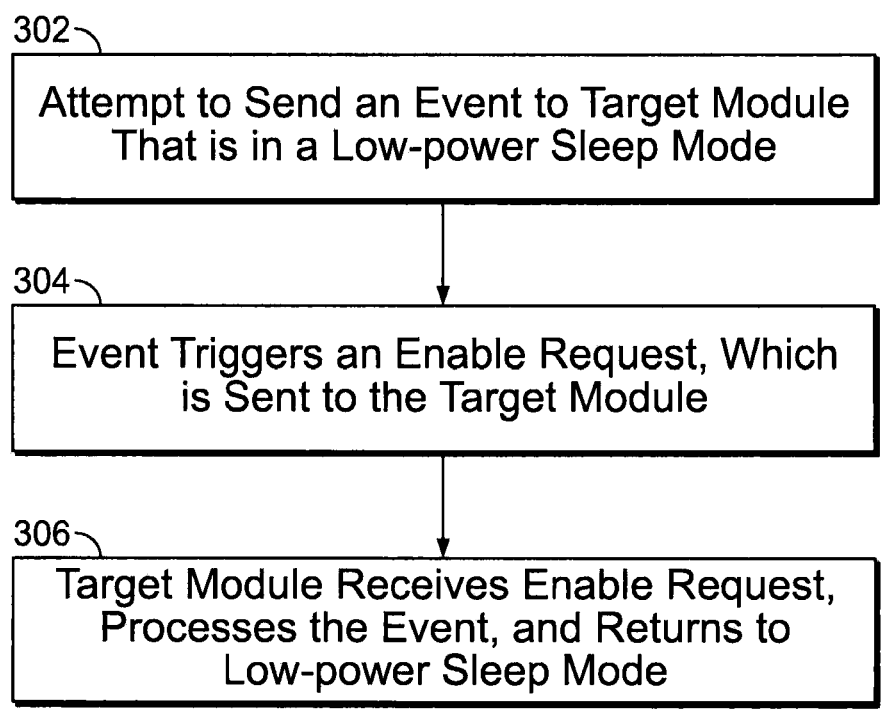
FIG. 8 is a flow chart illustrating an example of a sleep-walking feature.

The sleepwalking feature allows modules that form part of the event system (e.g., timekeeper 240, V-ADC 204, C-ADC 206, and current protection module 208) to continue to perform critical safety or other functions even when system 130 is in a low-power (e.g., sleep) mode. Thus, as shown for example in FIG. 8, if timekeeper 240 attempts to send an event to V-ADC module 204, C-ADC 206 or current protection module 208 while the target module is in a low-power mode (block 302), the event automatically triggers an enable request to the target module (block 304). In response to receiving the enable request, the target module processes the event and then returns to sleep (block 306). Thus, certain modules are enabled to perform specified tasks even while system 130 is in a sleep or other low-power mode such that the particular modules would not otherwise be allowed to operate in the absence of the sleepwalking feature. Furthermore, the sleepwalking feature operates independently of CPU 202. Therefore, the specified tasks can be performed without waking CPU 202.

A particular example of how the sleepwalking feature can be used in the illustrated implementation is as follows. C-ADC module 206 has a programmable sample mode so that it can perform an instantaneous conversion for a measured battery current value. Timekeeper 240 triggers events so that C-ADC 206 samples battery current values at a regular interval. If C-ADC module 206 is in a sleep mode when the sampling is to take place, the sleepwalking feature allows C-ADC module 206 to wake up and perform the instantaneous conversion.

Likewise, if V-ADC module 204, C-ADC 206 or current protection module 208 attempts to send an event to FET controller 216 while the FET controller is in a low-power mode, the event automatically triggers an enable request to the FET controller so that the FET controller processes the event and then returns to sleep.

In some implementations, timekeeper 240 is connected to a timer/counter 242 (FIGS. 3 and 5), which can be used, for example, to keep track of time. If system 130 is in a low-power mode when a timekeeper event is triggered, the sleep-walking feature can be used so that the timer/counter 242 increases the counter value.

Diagnostic Functions

To provide enhanced safety, some implementations of battery management and protection system 130 include diagnostic features that can be used to ensure that the system is operating properly.

As explained below, various analog signals and values on external pins of battery management system 130 can be verified by CPU 202. If any diagnostic function is outside its expected range, CPU 202 can cause FET controller 216 to disable FETs 110, 112 (see FIG. 2) so as to maintain battery safety.

For example, voltage reference module 244 can have a window comparator that continuously monitors the VREF pin (see FIG. 2) to detect if the reference voltage is shorted to ground or to a power supply (VDD). If a short condition occurs, CPU 202 can cause FETs 110, 112 to be disabled so as to protect the system.

CPU 202 also can perform various diagnostic checks in connection with V-ADC module 204, which includes a dedicated battery channel (BATT) for FET failure detection, illegal charger detection and pin open detection. CPU 202 can perform one or more diagnostic checks by using signals on the battery channel. For example, when FETs 110, 112 are fully enabled, the voltage drop between the battery side and the charger/load side should be close to zero. After enabling FETs 110, 112, the difference between the battery channel voltage and the cell voltage can be calculated to detect whether the FET is turned on correctly. If the measured voltage is not within the expected range, CPU 202 can disable the FETs. FET failure similarly can be detected with separate differential channels that measure the FET voltage drop directly.

Similarly, when a charger is connected to battery management system (see FIG. 1), the battery channel can be used to check that the charge voltage is within an acceptable range before FETs 110, 112 are enabled. In addition, measuring the battery channel while FETs 110, 112 are enabled can be used to detect that the battery pin is not properly connected to a printed circuit board. If the result is very different from the battery cell voltage, CPU 202 can disable the FETs.

CPU 202 also can perform diagnostic checks with respect to the PV1 and NV pins of V-ADC module 204 (see FIGS. 2 and 5). For example, for the PV1 pin, CPU 202 can enable an internal pull-down resistor to detect if CPU 202 has a good connection to the cell positive terminal. If the result is significantly lower than expected while the pull-down resistor is enabled, CPU 202 determines that there is a poor connection. For the NV pin, CPU 202 can enable an internal pull-up resistor to detect a poor connection to the cell negative terminal. With the pull-up resistor enabled, the difference between the voltages at the NV and PV pins will decrease significantly if there is a poor connection to the cell. On the other hand, if there is a good connection, there will be a small voltage difference. If either result is outside the expected range, CPU 202 can disable FETs 110, 112. In some implementations, if a protection scan is started while executing these diagnostic functions, the pull-up and pull down resistors will be disabled automatically, thereby ensuring a proper result from the protection scan.

CPU 202 also can perform diagnostic checks with respect to the PI and NI pins of C-ADC module 206 (see FIGS. 2 and 5), both of which have internal pull-up sources to detect a poor connection to sense resistor 114. When the pull-up resistor is enabled for the PI or the NI pin and the pin has a poor connection, the conversion result will saturate to a maximum conversion value. In some implementations, if a protection scan is started while executing these diagnostic functions, the pull-up and pull down resistors automatically will be disabled, ensuring a proper result from the protection scan.

Various advantages that are present in some implementations of system 130 are discussed above. Some implementations of system 130 may include other advantages in addition to, or instead of, the advantages discussed above. For example, firmware (i.e., CPU 202) can control an initial configuration to adapt to specific application requirements, and then can let the system perform autonomously. As firmware only handles the initial configuration, the effort to verify that the configuration is correct is relatively low. Once the configuration is set up, hardware automatically handles safety critical functions without the need for firmware intervention. Firmware can optionally lock the configuration registers from further CPU write access to ensure that firmware errors cannot affect safe operation.

The system can help simplify customer product qualification by eliminating some possibilities of firmware errors that may make the safety of the system unreliable. This greatly reduces the efforts required to qualify the system for various required safety approvals. Improved accuracy of the system in some implementations can reduce the possibility of undetected, unsafe operating conditions of a Li-Ion battery. Thus, battery safety can be improved.

The improved accuracy of the system can allow battery pack designers to charge the battery pack with more energy, without increasing the risk of exceeding the safe limits of the battery cell. This increased battery capacity makes more energy available to the user per unit charge. The improved accuracy can also give a better indication of remaining battery life. This can help reduce or eliminate situations in which the reported battery capacity suddenly drops very quickly from an indication that there is a reasonable amount of capacity remaining to an indication that there is very little capacity remaining and that the system should be disabled.

As explained above, some features of system 130 can help reduce power consumption. The reduced power consumption can lead to increased shelf-life for new battery packs, as well as a reduced risk of unintentionally discharging a battery cell to an unsafe and damaging level.

Other implementations are within the scope of the claims.

What is claimed is:

1. A battery management and protection system comprising:
   a plurality of modules each of which is configured to determine whether a respective operational characteristic of a battery is within a predetermined range;
   memory storing safety parameters and timing information; and
   a timekeeper operable to generate, independently of a central processing unit, pulse signals configured to trigger actions by the modules, the pulse signals having different respective frequencies,
   wherein a first one of the modules is arranged to select a first one of the pulse signals having a first frequency, and a second one of the modules is arranged to select a second one of the pulse signals having a different second frequency, and
   wherein each respective pulse signal selected by a particular module triggers a measurement or a safety detection by the particular module based on the safety parameters and timing information in the memory.

2. The system of claim 1 wherein the pulse signals are divided from one another.

3. The system of claim 1 wherein the pulse signals are divided respectively from one another by powers of two.

4. The system of claim 1 wherein the pulse signals include a first pulse signal having a frequency F, a second pulse signal having a frequency F/2, a third pulse signal having a frequency F/4, a fourth pulse signal having a frequency F/8 and a fifth pulse signal having a frequency F/16.

5. The system of claim 1 wherein the pulse signals are synchronous.

6. The system of claim 1 wherein at least one of the modules is arranged to monitor at least one of voltage, current or temperature of a battery when the battery is coupled to the system, and wherein at least one of the pulse signals triggers an action related to the monitoring in the at least one module.

7. The system of claim 6 wherein at least one of the modules is arranged to use one or more of the pulse signals to scan measurements of battery operating characteristics and to trigger responses to the measurements.

8. The system of claim 1 further including a dedicated routing network to pass respective ones of the pulse signals from the timekeeper to respective ones of the modules.

9. The system of claim 8 wherein the dedicated routing network passes the respective ones of the pulse signals directly from the timekeeper to the respective modules.

10. The system of claim 8 wherein the dedicated routing network passes the respective ones of the pulse signals from the timekeeper to the respective modules independently of the central processing unit.

11. The system of claim 8 wherein one or more of the modules that receive a pulse signal from the timekeeper are arranged to receive signals indicative of at least one of voltage, current or temperature of a battery when the battery is coupled to the system.

12. The system of claim 8 wherein the dedicated routing network is arranged to pass an event from a first one of the modules to another module, wherein the event is indicative of a change in state detected by the first one of the modules.

13. The system of claim 1 wherein the system has one or more low-sleep modes, wherein the modules are operable to receive and respond to pulse signals from the timekeeper even if the module is in a low-power sleep mode.

14. A method of operating a battery management and protection system, the method comprising:

generating, by a timekeeper, independently of a central processing unit, a set of pulse signals having different respective frequencies; and providing, independently of the central processing unit, one or more of the pulse signals from the timekeeper to a plurality of modules in the system, wherein a first one of the modules selects a first one of the pulse signals having a first frequency, and a second one of the modules selects a second one of the pulse signals having a different second frequency, wherein the selected pulse signals trigger performance of respective actions by the modules, and wherein each respective pulse signal selected by a particular module triggers a measurement or a safety detection by the particular module based on safety parameters and timing information stored in memory.

15. The method of claim 14 wherein the pulse signals are divided from one another.

16. The method of claim 14 wherein the pulse signals are divided respectively from one another by powers of two.

17. The method of claim 14 wherein the pulse signals include a first pulse signal having a frequency F, a second pulse signal having a frequency F/2, a third pulse signal having a frequency F/4, a fourth pulse signal having a frequency F/8 and a fifth pulse signal having a frequency F/16.

18. The method of claim 14 wherein the pulse signals are synchronous.

19. The method of claim 14 wherein the modules receive the selected pulse signals and perform the respective actions even if the modules are in a low-power sleep mode.

* * * * *